United States Patent
Tiziani et al.

(10) Patent No.: US 6,291,893 B1
(45) Date of Patent: Sep. 18, 2001

(54) POWER SEMICONDUCTOR DEVICE FOR "FLIP-CHIP" CONNECTIONS

(75) Inventors: Roberto Tiziani, Nerviano; Paolo Crema, Vimercate; Marco Mantovani, Barbaiana di Lainate, all of (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/237,407

(22) Filed: Jan. 26, 1999

(30) Foreign Application Priority Data

Oct. 3, 1998 (EP) .................................... 98830132

(51) Int. Cl.[7] ........................... H01L 23/48; H01L 23/52; H01L 29/40
(52) U.S. Cl. ....................... 257/778; 257/706; 257/712; 257/713
(58) Field of Search .................. 257/706, 712, 257/713, 720, 778, 796, 707, 717, 729, 737, 738, 780

(56) References Cited

U.S. PATENT DOCUMENTS

| | | | |
|---|---|---|---|
| 5,508,230 | * | 4/1996 | Anderson et al. .................. 438/125 |
| 5,866,942 | * | 2/1999 | Suzuki et al. ..................... 257/698 |
| 5,977,626 | * | 11/1999 | Wang et al. ...................... 257/707 |

FOREIGN PATENT DOCUMENTS

| | | | |
|---|---|---|---|
| 0 600 590 | 6/1994 | (EP) | ............................. H01L/23/36 |
| 0 637 078 | 2/1995 | (EP) | ............................ H01L/23/373 |

OTHER PUBLICATIONS

Patent Abstracts of Japan, vol. 011, No. 376 (E–563), Dec. 8, 1987 & JP 62144346 A (Matsushita Electric Ind. Co. Ltd.).
Patent Abstracts of Japan, vol. 018, No. 299 (E–1558), Jun. 8, 1994 & JP 06 061304 A (NEC Corp.).

* cited by examiner

Primary Examiner—Stephen D. Meier
Assistant Examiner—Jamie L. Brophy
(74) Attorney, Agent, or Firm—Theodore E. Galanthay; Allen, Dyer, Doppelt, Milbrath & Gilchrist, P.A.

(57) ABSTRACT

An electronic device is formed on a chip of semiconductor material covered by a layer of insulating material. Metal interconnection elements form, on the insulating layer, connection pads to which a soldering material is applied. To permit good heat dissipation, the device has a metal plate partially incorporated in the insulating layer and having a surface which is coplanar with the pads and to which soldering material is applied. The electronic device is secured to a mounting substrate having a corresponding metal plate.

18 Claims, 2 Drawing Sheets

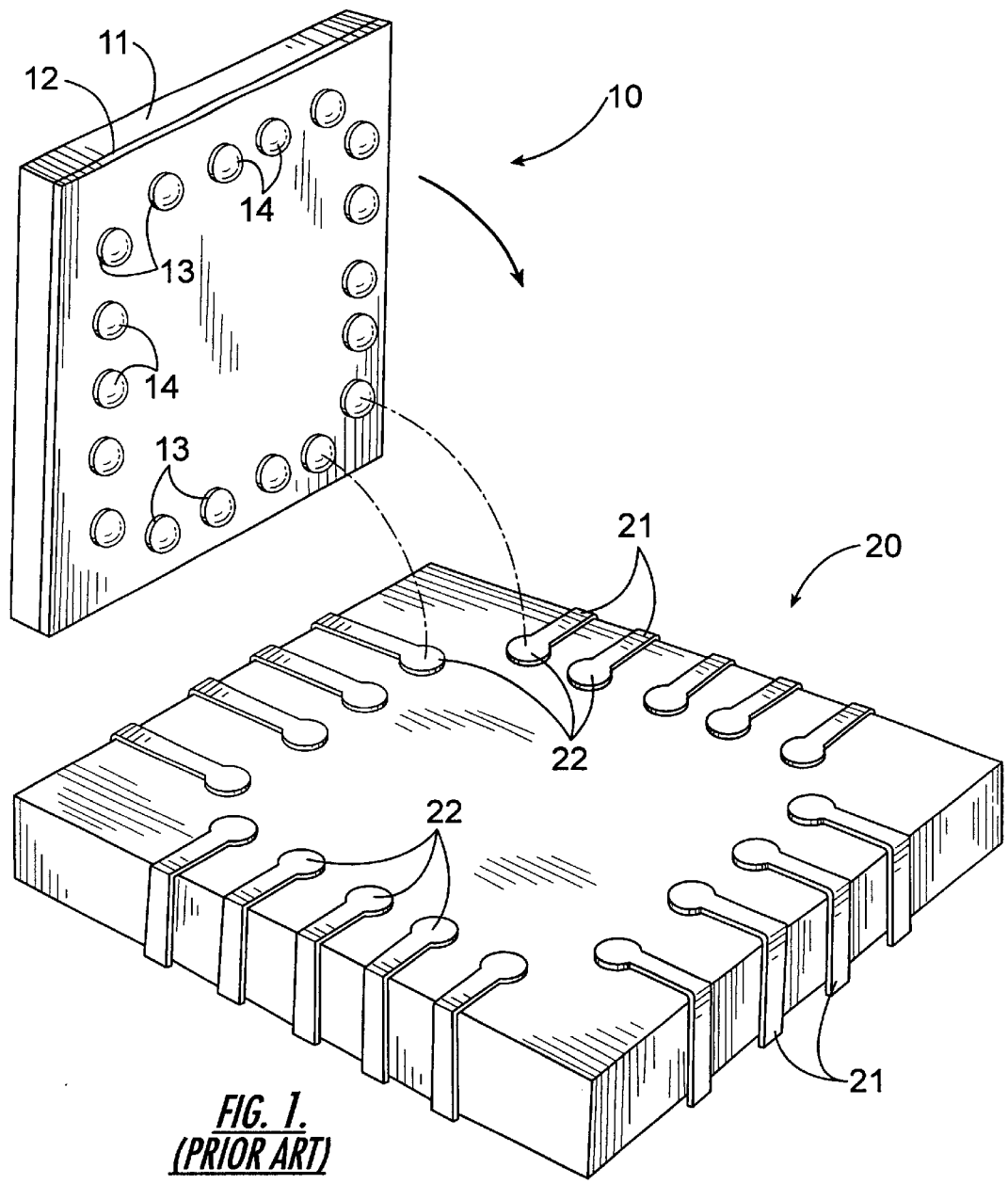
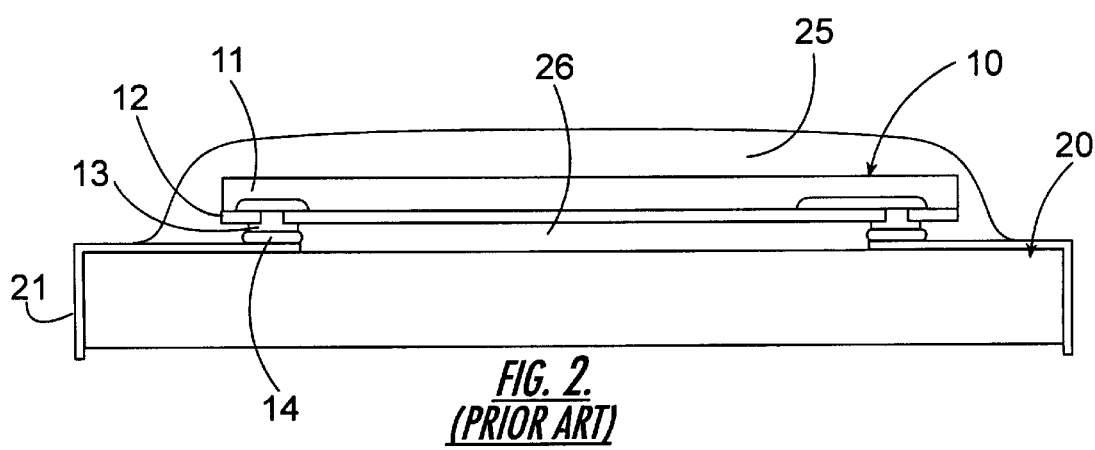
FIG. 1.
(PRIOR ART)
FIG. 2.
(PRIOR ART)

POWER SEMICONDUCTOR DEVICE FOR "FLIP-CHIP" CONNECTIONS

FIELD OF THE INVENTION

The present invention relates to semiconductor devices, and, more particularly, to a semiconductor device and the connections thereto.

BACKGROUND OF THE INVENTION

As is known, an electronic semiconductor device, for example, an integrated circuit, is formed by a chip of semiconductor material which contains the active portions of the device. The integrated circuit also includes a structure for supporting the chip and for forming electrical interconnections thereby enabling the device to be connected to an external circuit.

Upon completion of its manufacture, the chip has a surface covered by a layer of insulating material. On the surface of the insulating material, metal interconnection elements appear in the form of pads which define the terminals of the electronic device.

An interconnection technique known as the "flip-chip" technique provides for a flat mounting substrate of insulating material on which there are metal tracks which terminate in areas arranged in a configuration mirroring that of the pads on the chip. A soldering material, for example, an alloy of lead and tin, is applied to the pads and, typically, takes the form of a hemispherical projection (a bump) on each pad. The chip is then placed on the mounting substrate with the pads mounted by the bumps in registry with the terminal areas of the metal tracks. The assembly is brought to the melting point of the soldering material so that the soldering material melts and, after cooling, solders the pads of the chip to the corresponding metal areas of the substrate. Finally, a thermosetting resin capsule is formed, incorporating the chip.

In comparison with another widely used interconnection technique which uses thin wires soldered at one end to the pads of the chip and at the other end to the metal terminals which form part of a terminal structure (a lead frame) which surrounds the chip, the "flip-chip" technique has various advantages. In particular, it enables contact pads to be arranged over the entire area of the chip and not only along the perimeter as is necessary with the other technique. The flip chip approach also permits very short interconnections and, finally, it takes up little space.

However, it may not be suitable for use in power applications in which the chip of semiconductor material is subject to a very high degree of heating. This is so since very little heat is dissipated from the chip to the substrate. The chip is joined to the substrate by only a few points with low thermal resistance which are the soldering points. Most of its surface is separated from the substrate by a space which is filled with the resin in which the chip is incorporated. Although the space is very shallow, the heat dissipation is limited by the relatively high thermal resistance of the resin.

To reduce the thermal resistance of the resin, it is known to include therein particles of material having lower thermal resistance. Even this measure does not greatly improve the performance of the device in power applications.

SUMMARY OF THE INVENTION

The object of the present invention is to propose a semiconductor device which can be connected by the "flip-chip" technique and which has good performance in power applications.

This object is achieved by a semiconductor device comprising a chip of semiconductor material, an electronic device formed at least partially in the chip and having a plurality of contact areas, and a layer of insulating material covering a major surface of the chip. A plurality of interconnection elements extends through the layer of insulating material from the contact areas to an opposite surface of the layer of insulating material defining substantially coplanar connection pads on the opposite surface. A plurality of solder elements are on the connection pads. The device also includes at least one metal plate extending on the layer of insulating material and having an extensive surface substantially coplanar with the connection pads. In addition, at least one soldering element is provided on the extensive surface of the at least one metal plate.

The metal plate is preferably partially incorporated into the layer of insulating material. The at least one metal plate may be in contact with a contact area of the electronic device. The at least one solder element on the extensive surface of the metal plate may comprise a plurality of solder elements, or a single continuous body of solder on the extensive surface of the metal plate. Of course, the electronic device may comprise a power component.

The invention is also directed to an integrated circuit assembly comprising the semiconductor device and a mounting substrate connected to the semiconductor device. More particularly, the mounting substrate preferably comprises a plurality of connection pads being connected to the connection pads of the semiconductor device, and at least one metal plate having an extensive surface connected to the extensive surface of the at least one metal plate of the semiconductor device.

A method aspect of the invention is for flip chip mounting of a semiconductor device on a mounting substrate. The method preferably comprises the steps of: providing at least one metal plate exposed on an insulating layer of the semiconductor device to be substantially coplanar with contact pads on the insulating layer; providing at least one metal plate exposed on the mounting substrate adjacent contact pads on the mounting substrate; and connecting the semiconductor device and the mounting substrate so that corresponding contact pads are connected together and so that corresponding metal plates are connected together.

BRIEF DESCRIPTION OF THE DRAWINGS

The invention will be understood better from the following detailed description of an embodiment thereof, given by way of non-limiting example with reference to the appended drawings, in which:

FIG. 1 shows, in perspective, a device according to the prior art being mounted on a mounting substrate by the "flip-chip" technique;

FIG. 2 shows, in section, a semiconductor device according to the prior art soldered onto a mounting substrate and encapsulated;

DETAILED DESCRIPTION OF THE PREFERRED EMBODIMENTS

Figure 3:
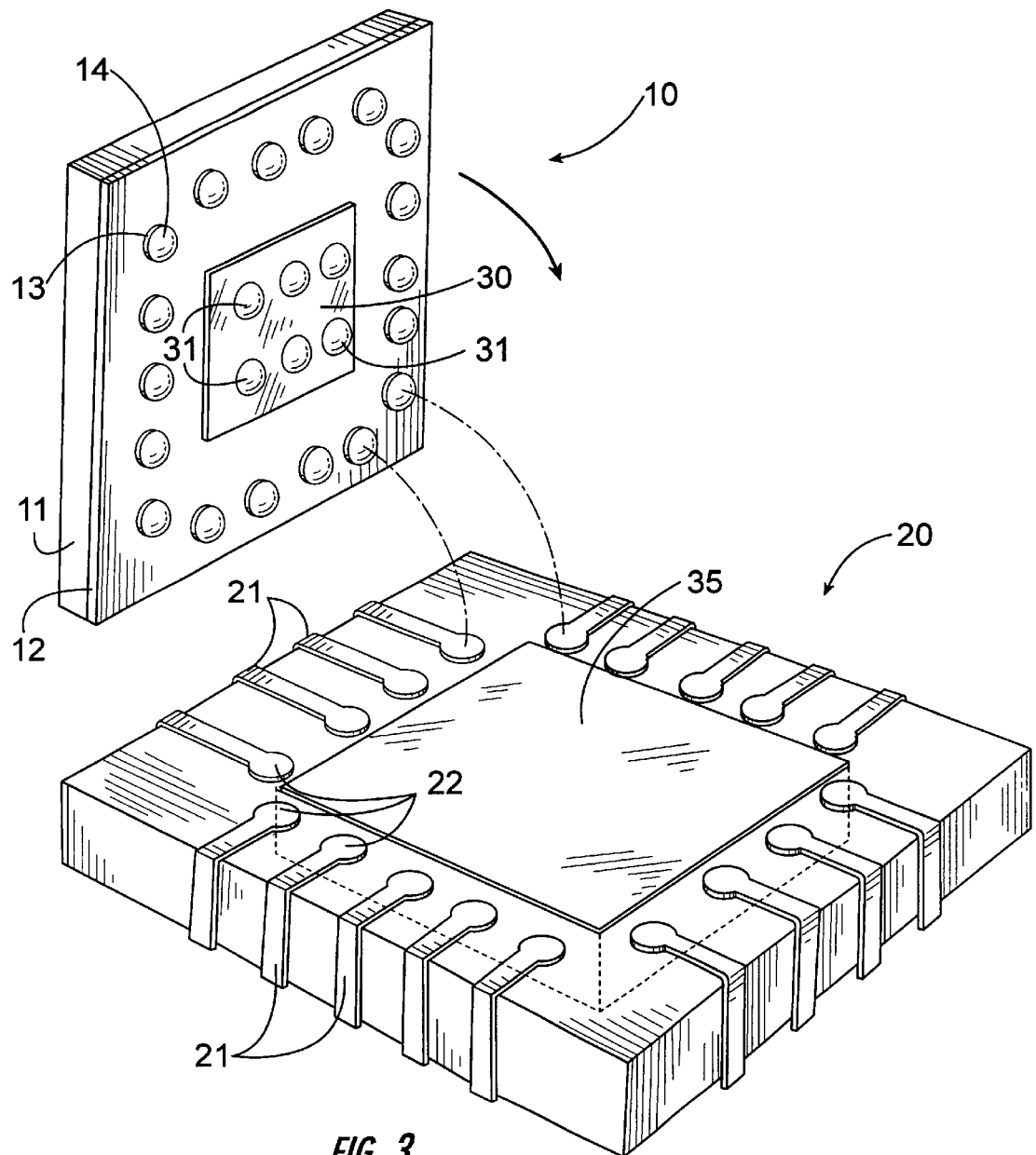
FIG. 3 shows, in perspective, a semiconductor device according to the invention being mounted on a mounting substrate.

Upon completion of the manufacturing process, a known semiconductor device appears as shown in FIG. 1, in which it is generally indicated 10. It is formed by a chip 11 of semiconductor material, for example, silicon, with a surface covered by a layer 12 of insulating material, for example, silicon dioxide. Substantially coplanar metal pads 13 which are the ends of the electrical connections to the active portions of the electronic device, appear on the surface 12 and are topped by bumps 14 of soldering material, for example, an alloy of lead and tin.

The device 10 is ready to be mounted on a flat mounting substrate 20 of an insulating material, for example, a ceramic material. On the mounting substrate 20 are metal tracks 21 which terminate, on the upper surface of the substrate, in areas 22 arranged in the same configuration as the pads 13 of the device 10. The metal tracks 21 in this example extend over the edges of the substrate 20 to be soldered to a printed circuit board, not shown. In another application, the substrate could itself be a printed circuit board. In yet another application, the mounting substrate could have interconnection elements which extend through its entire thickness and terminate in contact areas on both of its faces.

FIG. 2 shows the device 10 on the mounting substrate 20 after the pads 13 have been soldered to the terminal areas 22 of the metal tracks 21 by the soldering material of the bumps 14. As can be seen, the pads 13 are the end surfaces of metal interconnection elements which extend through the insulating layer 12 from contact areas of the chip 11 of semiconductor material to the surface of the layer 12. Moreover, some of the interconnection elements may not be in contact with areas of the chip, but are in contact with areas of electrically-conductive elements electrically insulated from the chip, for example, gate electrodes or capacitor electrodes.

The next manufacturing step is the application of a drop 25 of thermosetting resin, for example, an epoxy resin, which may be filled with grains of silica to increase its thermal conductivity. This flows into the space 26 between the opposed surfaces of the device 20 and of the substrate 20 and encloses the entire chip, sealing it on the substrate and insulating it from the outside environment.

Figure 4:
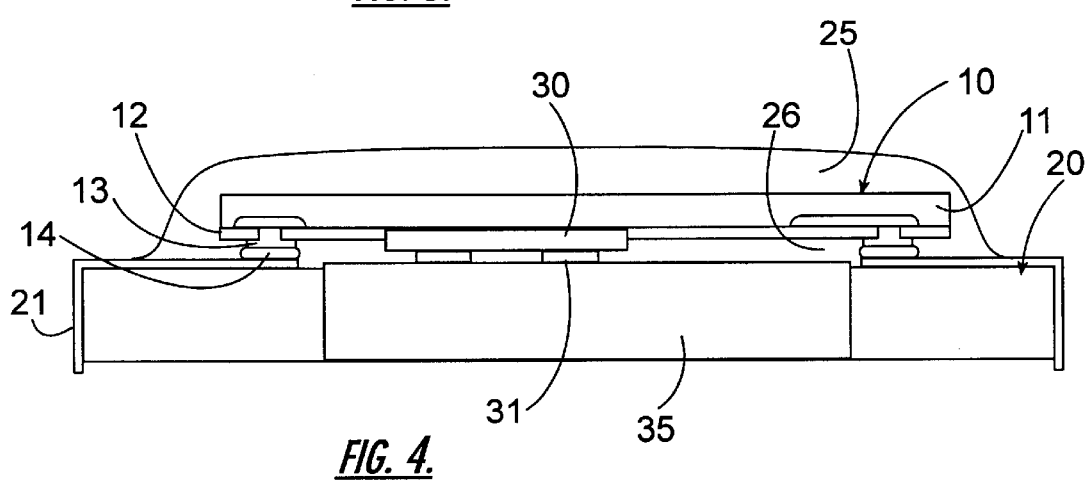
FIG. 4 shows, in section, a semiconductor device soldered to a mounting substrate according to the invention.

In FIGS. 3 and 4, in which elements identical or corresponding to those of FIGS. 1 and 2 are indicated by the same reference numerals, the semiconductor device according to the invention has a metal plate 30 extending over the layer of insulating material 12. In this embodiment, the plate 30 is partially incorporated in the layer of insulating material 12 so as to have an extensive uncovered surface substantially coplanar with the pads 13. The plate 30 is arranged in the region of a power component of the electronic device formed in the chip 11. It may be formed by the same steps of the manufacturing process by which the metal connections which terminate on the surface in the pads 13 are formed. Moreover, it may be completely insulated from the surface of the chip 12 of semiconductor material, or it may be in contact with a predetermined area thereof. In this latter case, the plate 30 provides a terminal of the device.

Bumps 31 similar to those indicated 14 formed on the pads 13, are formed on the plate 30. The bumps 14 and 31 can be formed simultaneously and by the same manufacturing steps, for example, by a galvanic deposition (electroplating) process. Alternatively, if a screen printing process is used, it is advantageous to form a single element of soldering material on the plate 30, that is, a layer of soldering material over its entire surface.

The mounting substrate 20 of FIG. 3 differs from that of FIG. 1 in that it contains a metal element 35 which has a relatively extensive surface, to which the plate 30 of the device 10 is soldered, as shown in FIG. 4.

The metal element 35 extends through the entire thickness of the mounting substrate 20 and can be put into contact with an external heat sink, not shown, by its opposite surface to that which is soldered to the device 10. With this structure, it is possible to achieve very efficient dissipation of the heat generated by the semiconductor device in operation.

Naturally, the metal element 35 may have a different structure, for example, it could extend only on the surface of the substrate 20 without extending through it. In any case, the efficiency of the heat dissipation is much greater than that which can be achieved by the known technique, by virtue of the low thermal resistance of the metal contacts and the relatively large extent of the contacting metal surfaces.

That which is claimed is:

1. A semiconductor device comprising:
   a chip of semiconductor material;
   an electronic device formed in the chip and having a plurality of contact areas;
   a layer of insulating material covering a major surface of the chip;
   a plurality of interconnection elements extending through the layer of insulating material from the contact areas to an opposite surface of the layer of insulating material defining substantially coplanar connection pads on the opposite surface;
   a plurality of solder elements on the connection pads;
   at least one metal plate extending on the layer of insulating material and having an extensive surface substantially coplanar with the connection pads; and
   at least one metal plate solder therefor element on the extensive surface of the at least one metal plate.

2. A device according to claim 1, wherein said at least one metal plate is partially incorporated into the layer of insulating material.

3. A device according to claim 1, wherein said at least one metal plate is in contact with one of the contact areas of the electronic device.

4. A device according to claim 1, wherein said at least one metal plate solder element on the extensive surface of said at least one metal plate comprises a plurality of metal plate solder elements on the extensive surface of the at least one metal plate.

5. A device according t o claim 1, wherein said at least one metal plate solder element on the extensive surface of said at least one metal plate comprises a single body of metal plate solder material covering the entire extensive surface of the at least one metal plate.

6. A device according to claim 1, wherein said electronic device comprises a power component.

7. A semiconductor device comprising:
   a chip of semiconductor material;
   an electronic device formed in the chip and having a plurality of contact areas;
   a layer of insulating material covering a major surface of the chip;
   a plurality of interconnection elements extending through the layer of insulating material from the contact areas to an opposite surface of the layer of insulating material defining substantially coplanar connection pads on the opposite surface;
   a plurality of solder elements on the connection pads;
   at least one metal plate extending on the layer of insulating material and having an extensive surface substantially coplanar with the connection pads, said at least one metal plate being connected to at least one of the contact areas of said electronic device; and at least one metal plate solder element on the extensive surface of the at least one metal plate.

8. A device according to claim 7, wherein said at least one metal plate is partially incorporated into the layer of insulating material.

9. A device according to claim 7, wherein said at least one metal plate solder element on the extensive surface of said at least one metal plate comprises a plurality of metal plate solder elements on the extensive surface of the at least one metal plate.

10. A device according to claim 7, wherein said at least one metal plate solder element on the extensive surface of said at least one metal plate comprises a single body of metal plate solder material covering the entire extensive surface of the at least one metal plate.

11. A device according to claim 7, wherein said electronic device comprises a power component.

12. An integrated circuit assembly comprising:

a semiconductor device and a mounting substrate connected to said semiconductor device, said semiconductor device comprising a chip of semiconductor material, an electronic device formed in the chip and having a plurality of contact areas, a layer of insulating material covering a major surface of the chip, a plurality of interconnection elements extending through the layer of insulating material from the contact areas to an opposite surface of the layer of insulating material defining substantially coplanar connection pads on the opposite surface, and at least one metal plate extending on the layer of insulating material and having an extensive surface substantially coplanar with the connection pads; and said mounting substrate comprising a plurality of second connection pads being connected to the connection pads of said semiconductor device, and at least one second metal plate having an extensive surface substantially coplanar with the second connection pads, the second metal plate being connected to the extensive surface of the at least one metal plate of said semiconductor device.

13. An integrated circuit assembly according to claim 12, further comprising solder connecting the connection pads of said semiconductor device and the second connection pads of said mounting substrate together.

14. An integrated circuit assembly according to claim 12, further comprising solder connecting the at least one metal plate of said semiconductor device and the second metal plate of said mounting substrate together.

15. An integrated circuit assembly according to claim 12, wherein said at least one second metal plate of said mounting substrate extends fully through the mounting substrate for connection to an external heat sink.

16. An integrated circuit assembly according to claim 12, wherein said at least one metal plate of said semiconductor device is partially incorporated into the layer of insulating material.

17. An integrated circuit assembly according to claim 12, wherein said at least one metal plate of said semiconductor device is in contact with a contact area of the electronic device.

18. An integrated circuit assembly according to claim 12, wherein said electronic device comprises a power component.

\* \* \* \* \*

UNITED STATES PATENT AND TRADEMARK OFFICE
CERTIFICATE OF CORRECTION

PATENT NO. : 6,291,893 B1
DATED : September 18, 2001
INVENTOR(S) : Roberto Tiziani, Paolo Crema and Marco Mantovani Page 1 of 1

It is certified that error appears in the above-identified patent and that said Letters Patent is hereby corrected as shown below:

Column 4,
Line 34, delete "solder thereof element" insert -- solder element --

Signed and Sealed this

Twenty-eighth Day of May, 2002

Attest:

*Attesting Officer*

JAMES E. ROGAN
*Director of the United States Patent and Trademark Office*

UNITED STATES PATENT AND TRADEMARK OFFICE
CERTIFICATE OF CORRECTION

PATENT NO. : 6,291,893 B1
DATED : September 18, 2001
INVENTOR(S) : Roberto Tiziani, Paolo Crema and Marco Mantovani It is certified that error appears in the above-identified patent and that said Letters Patent is hereby corrected as shown below:

<u>Title page,</u>
Delete "Oct. 3, 1998 (EP)…………………………..98830132" insert
-- Mar. 10. 1998 (EP)…………………………...98830132 --.

Signed and Sealed this

Sixth Day of August, 2002

Attest:

JAMES E. ROGAN
Attesting Officer
*Director of the United States Patent and Trademark Office*